(12) United States Patent
Shim et al.

(10) Patent No.: US 9,278,505 B2
(45) Date of Patent: Mar. 8, 2016

(54) THERMOSETTING RESIN COMPOSITION AND PREPREG AND METAL CLAD LAMINATE USING THE SAME

(75) Inventors: Hee-Yong Shim, Daejeon (KR); Jung-Jin Shim, Daejeon (KR); Jeong-An Kang, Daejeon (KR); Hyun-Sung Min, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/984,990

(22) PCT Filed: Jul. 20, 2012

(86) PCT No.: PCT/KR2012/005826
§ 371 (c)(1),
(2), (4) Date: Aug. 12, 2013

(87) PCT Pub. No.: WO2013/015577
PCT Pub. Date: Jan. 31, 2013

(65) Prior Publication Data
US 2013/0319609 A1 Dec. 5, 2013

(30) Foreign Application Priority Data

Jul. 22, 2011 (KR) .......................... 10-2011-0072874
Jul. 20, 2012 (KR) .......................... 10-2012-0079208

(51) Int. Cl.
| | |
|---|---|
| *B32B 17/04* | (2006.01) |
| *C08L 63/00* | (2006.01) |
| *D06N 3/12* | (2006.01) |
| *B32B 15/092* | (2006.01) |
| *H05K 1/03* | (2006.01) |
| *C08J 5/24* | (2006.01) |

(52) U.S. Cl.
CPC ............... *B32B 17/04* (2013.01); *B32B 15/092* (2013.01); *C08J 5/24* (2013.01); *C08L 63/00* (2013.01); *D06N 3/12* (2013.01); *H05K 1/0373* (2013.01); *C08J 2363/00* (2013.01); *C08J 2461/06* (2013.01); *C08J 2479/04* (2013.01); *H05K 2201/0209* (2013.01); *Y10T 442/2992* (2015.04)

(58) Field of Classification Search
CPC ....................................................... C08L 63/00

USPC .................................................. 523/400, 466
See application file for complete search history.

(56) References Cited

U.S. PATENT DOCUMENTS

| | | | | |
|---|---|---|---|---|
| 5,605,763 | A * | 2/1997 | Yusa et al. ................. | 428/473.5 |
| 6,187,874 | B1 * | 2/2001 | Yoshioka et al. ............. | 525/423 |
| 2011/0152394 | A1 * | 6/2011 | Pyun et al. .................... | 521/135 |

FOREIGN PATENT DOCUMENTS

| | | |
|---|---|---|
| CN | 1465212 A | 12/2003 |
| CN | 1541054 A | 10/2004 |
| EP | 2543687 A1 | 1/2013 |
| EP | 2612885 A1 | 7/2013 |
| JP | 05-140526 A | 6/1993 |
| JP | 2005-281394 A | 10/2005 |
| JP | 2006-143850 A | 6/2006 |
| JP | 2009-242657 A | 10/2009 |
| JP | 2010-285523 A | 12/2010 |
| JP | 2011-074397 A | 4/2011 |
| KR | 10-2007-0056111 A | 5/2007 |
| KR | 10-2007-0110455 A | 11/2007 |
| KR | 10-2011-0002838 A | 1/2011 |
| TW | 591054 B | 6/2004 |
| WO | 2011/108524 A1 | 9/2011 |
| WO | 2012/029690 A1 | 3/2012 |

OTHER PUBLICATIONS

Machine translation of JP 05-140526, published Jun. 8, 1993.*

* cited by examiner

*Primary Examiner* — Vickey Nerangis
(74) *Attorney, Agent, or Firm* — Rothwell, Figg, Ernst & Manbeck, P.C.

(57) ABSTRACT

The present invention relates to a thermosetting resin composition used in a printed circuit board for a semiconductor package, and a prepreg and a metal clad laminate using the same. More particularly, the present invention provides a thermosetting resin composition that includes a mixture of a BT or cyanate resin and an epoxy resin and a specific content of a novolac resin as a curing agent so as to inhibit separation of the resin and an inorganic filler during a process of laminating a prepreg on a metal foil, thereby providing a printed circuit board having a uniform insulation layer, and a prepreg and a metal clad laminate for a double-sided or multilayer printed circuit board that are manufactured by using the same.

8 Claims, No Drawings

THERMOSETTING RESIN COMPOSITION AND PREPREG AND METAL CLAD LAMINATE USING THE SAME

CROSS REFERENCE TO RELATED APPLICATIONS

This application is a 35 U.S.C. §371 National Phase Entry Application from PCT/KR2012/005826, filed Jul. 20, 2012, and designating the United States, which claims priority under 35 U.S.C. §119 to Korean Patent Application No. 10-2011-0072874 filed Jul. 22, 2011 and to Korean Patent Application No. 10-2012-0079208 filed Jul. 20, 2012, which are incorporated herein in their entireties.

TECHNICAL FIELD

The present invention relates to a thermosetting resin composition that is used in a printed circuit board (PCB) for a semiconductor package, and a prepreg and a metal clad laminate using the same.

BACKGROUND ART

In general, a double-sided printed circuit board is based on a CCL (copper clad laminate) having copper (cu) foils laminated on both sides of an insulation member. To create electrical paths in both copper foils, holes are formed using a drill, and copper electroplating is performed to connect both copper foils by a plating layer. Then, a UV sensitive dry film is applied for circuit formation, followed by UV radiation for selective patterning. Thereafter, circuit patterns are formed on both copper foils by etching, and PSR (Photoimagable Solder Resist) is applied thereto for insulation. Surface treatment such as gold plating is performed on the surface where final parts are mounted, thereby manufacturing the double-sided printed circuit board.

A multilayer printed circuit board can be also manufactured in the same way as the double-sided printed circuit board, until the step of circuit formation. After circuit formation, a prepreg and a copper foil are laminated on the top and bottom instead of applying PSR thereon, followed by heating and pressing. Thus, the multilayer printed circuit board means a build-up board including a plurality of PCB. In the multilayer printed circuit board, via-holes can be formed by a laser process for electrical connection between internal and external circuit patterns, and the inner surface of the via-hole is plated to manufacture the printed circuit board. Thereafter, if necessary, a solder-resist layer can be further formed as a protecting layer on the plating layer, or additional external layers can be formed.

Meanwhile, the copper clad laminate can be produced using a prepreg that is a raw material for the printed circuit board for the semiconductor package. In addition, the conventional prepreg and copper clad laminate used in the printed circuit board for the semiconductor package are basically required to have physical properties of high heat resistance, high rigidity, and low coefficient of thermal expansion (Low CTE), and thus a larger amount of inorganic filler relative to a resin has been used.

In this regard, when the inorganic filler is used in an excessive amount of 50% or more relative to the total weight, separation between the resin and the inorganic filler occurs during a high-temperature and high-pressure lamination process, and thus a substrate may have a non-uniform insulation layer. That is, when the BT resin and epoxy resin are conventionally used, the curing occurs at around 200° C. Thus, during heating and pressing of the prepreg laminated on the metal foil, flowability of the resin and inorganic filler becomes poor, resulting in separation therebetween. Such separation may cause a deterioration of physical properties of the substrate, and in particular, it negatively affects heat resistance and reliability.

However, thermosetting resin compositions capable of preventing separation of the resin and the inorganic filler while having excellent heat resistance, and methods for providing a metal clad laminate for a printed circuit board using the same have not been developed yet.

During the manufacturing process of the multilayer printed circuit board, a prepreg for the multilayer and a copper foil are laminated, and then the external copper foil is processed in the same manner as in the internal circuit formation, and PSR is applied to manufacture a 4-layer printed circuit board. However, as the prepreg for copper clad laminate (CCL) that is produced by direct pressing in a CCL maker and the prepreg for the multilayer that fills the internal circuit patterns by pressing in a PCB maker are compared to each other, the prepreg for the multilayer has a higher content of the resin (containing an inorganic filler) relative to a glass fiber and high flowability, which increase the separation of resin/inorganic filler.

DISCLOSURE

Technical Problem

Accordingly, the present invention is intended to provide a thermosetting resin composition that does not cause separation between a resin and an inorganic filler after a lamination process, even though the inorganic filler is used in an excessive amount of approximately 50% or more.

Another object of the present invention is to provide a prepreg that is produced by using the thermosetting resin composition, and a method for manufacturing a metal clad laminate applicable to both double-sided and multilayer printed circuit boards using the prepreg.

Technical Solution

The present invention provides a thermosetting resin composition, comprising: (d) approximately 120 to 300 parts by weight of an inorganic filler, based on 100 parts by weight of a resin mixture including (a) approximately 10 to 55% by weight of a bismaleimide-triazine or cyanate-based resin; (b) approximately 35 to 80% by weight of an epoxy resin; and (c) approximately 5 to 15% by weight of a multi-functional phenolic resin having a hydroxyl equivalent weight of approximately 100 to 300 as a curing agent.

The thermosetting resin composition may further comprise a solvent; and one or more additives selected from the group consisting of a curing accelerator, a flame retardant, a lubricant, a dispersing agent, a plasticizer and a silane coupling agent.

Further, the present invention provides a prepreg that is produced by impregnating a fiber base material with the thermosetting resin composition.

Further, the present invention provides a method for manufacturing a metal clad laminate, comprising the step of integrating a metal foil including the prepreg by heating and pressing.

Hereinafter, a thermosetting resin composition according to a specific embodiment of the present invention will be described in detail.

The present invention relates to a thermosetting resin composition comprising a bismaleimide triazine (hereinafter, referred to as BT) or cyanate resin and an epoxy resin and a multi-functional phenolic resin having a specific equivalent weight of a hydroxyl group as a curing agent, which inhibits separation of the resin and an inorganic filler during a process of integrating a laminate of a prepreg and a metal foil by heating and pressing, thereby providing a printed circuit board having a uniform insulation layer. Further, the present invention relates to a prepreg that is produced by using the thermosetting resin, and a method for manufacturing a metal clad laminate using the prepreg. Preferably, the thermosetting resin, the prepreg, and the metal clad laminate according to the present invention can be applied to both a double-sided printed circuit board and a multilayer printed circuit board.

That is, the BT or cyanate resin and the epoxy resin are reacted at a high temperature of 200° C. or higher, while a specific content of a novolac resin used as a curing agent is first reacted at around 150° C., which inhibits abrupt flow of the resin and the inorganic filler during the lamination process. Such flow inhibition prevents separation of the resin and the inorganic filler, and the same effect can be achieved by additional use of an imidazole-based accelerator even though a smaller amount of the novolac resin is used. In the present invention, since 50% or more of the inorganic filler can be used according to the use of a specific content of the novolac resin, physical properties of high heat resistance, high rigidity and low coefficient of thermal expansion can be stably obtained.

According to one embodiment of the present invention, provided is a thermosetting resin composition comprising (a) a BT or cyanate-based resin, (b) an epoxy resin, (c) a novolac resin and (d) an inorganic filler. Preferably, the present invention provides a thermosetting resin composition comprising: (d) approximately 120 to 300 parts by weight of an inorganic filler, based on 100 parts by weight of a resin mixture including (a) approximately 10 to 55% by weight of a bismaleimide-triazine or cyanate-based resin, (b) approximately 35 to 80% by weight of an epoxy resin, and (c) approximately 5 to 15% by weight of a multi-functional phenolic resin curing agent having a hydroxyl equivalent weight of approximately 100 to 300.

The (a) BT or cyanate-based resin and the (b) epoxy resin mean typical thermosetting resins that are impregnated to the prepreg, and the type thereof is not limited.

For example, the BT resin is a thermosetting resin that can be used as an insulation layer of an electronic board required to have high performance and high integration, and it may have a weight average molecular weight of 2,000 to 5,000.

In addition, the cyanate resin shows high glass transition temperature due to increased crosslink density to show excellent thermal and electrical properties. The type of the cyanate resin is not particularly limited, and the cyanate resin well known to those skilled in the art can be used. Examples of the cyanate resin include a bisphenol A type cyanate resin, a bisphenol E type cyanate resin, a novolac type cyanate resin, a dicyclopentadiene bisphenol (DCPD bisphenol) type cyanate resin, a tetramethyl bisphenol F type cyanate resin or the like.

If necessary, the present invention may further include a cyanate ester-based resin having two or more cyanate groups within one molecule, and it may be in a prepolymeric form of monomers. In this regard, when varnishing is performed using monomers and a solvent, recrystallization occurs and thus impregnation is not possible. Therefore, a monomer conversion ratio of the cyanate compound in the prepolymerized cyanate ester resin is preferably 10 to 70 mol %, and more preferably 30 to 60 mol %. If the monomer conversion ratio of the cyanate compound is less than 10 mol %, recrystallization may occur, and if the monomer conversion ratio of the cyanate compound is more than 70 mol %, the viscosity of the varnish increases and thus it is difficult to impregnate the base material, and storage stability of the varnish is also reduced.

The epoxy resin may be one or more selected from the group consisting of a bisphenol A type epoxy resin, a phenol novolac epoxy resin, a tetraphenyl ethane epoxy resin, a naphthalene-based epoxy resin, a biphenyl-based epoxy resin and a dicyclopentadiene epoxy resin having the following Chemical Formula 1.

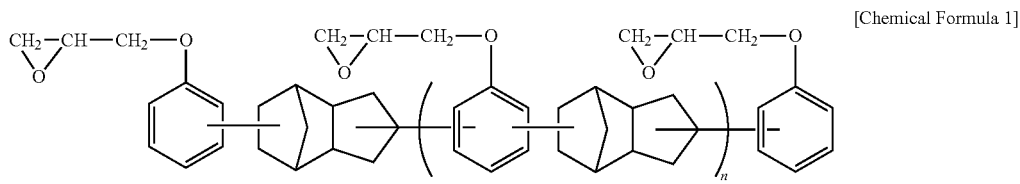

[Chemical Formula 1]

(wherein n is 0 or an integer of 1 to 50)

In the present invention, the resin mixture means (a) the BT or cyanate resin, (b) the epoxy resin, and (c) the novolac resin used as a curing agent. In this regard, the content range of the (a) and (b) resins and the content range of the (c) resin used as a curing agent may be properly adjusted to 100% by weight of the total resin mixture. For example, the (a) BT or cyanate resin may be used in an amount of 10 to 55% by weight, based on the total weight of the resin mixture. In addition, the (b) epoxy resin may be used in an amount of 35 to 80% by weight, based on the total weight of the resin mixture.

The (c) resin used as a curing agent in the present invention is characterized in that it is a multi-functional phenolic resin having a hydroxyl equivalent weight of approximately 100 to 300, and a specific content thereof in the composition of the present invention prevents separation of the resin and the inorganic filler.

Since most resins are reacted at a high temperature of 200° C. or higher, a press process of heating/pressing is typically performed at the maximum temperature of 220° C. According to the present invention, however, when the temperature reaches 150° C. through an initial heating process during the press process, a part thereof is only reacted by the curing agent to control flow, thereby preventing separation of resin/inorganic filler.

That is, the BT resins are melted and agglomerated with each other while the temperature is raised to high temperature of 200° C., and addition of the novolac resin induces a low temperature reaction so as to control flowability of the resin and the inorganic filler. Therefore, the present invention is characterized in that separation of the resin and the inorganic filler can be prevented after lamination of the prepreg on the metal foil, and thus a printed circuit board having a uniform insulation layer can be manufactured to achieve the physical properties of high heat resistance, high reliability and low coefficient of thermal expansion.

If the multi-functional phenolic resin curing agent has a hydroxyl equivalent weight of less than approximately 100, there is a problem in that flowability is excessively reduced, and if it has a hydroxyl equivalent weight of more than approximately 300, there is a problem in that use of the excessive amount thereof reduces the glass transition temperature and increases the coefficient of thermal expansion.

Such curing agent may be used in an amount of 5 to 15% by weight, based on the total weight of the resin mixture of (a) to (c). If the content of the curing agent is less than 5% by weight, it is impossible to perform low temperature curing, and thus separation of the resin and inorganic filler cannot be prevented. If the content of the curing agent is more than 15% by weight, the excessive content thereof increases the reactivity so as to reduce pattern filling and flowability.

The curing agent of the present invention may be produced by the typical method, and it is preferably made to have the above content of hydroxyl group. Examples of the curing agent may include novolac resins such as a phenol novolac resin, a bisphenol A novolac resin, a cresol novolac resin, a phenol-modified xylene resin, an alkyl phenol resin, and a phenol-modified melamine resin. If necessary, the present invention may further include resol phenol resins, and examples thereof include phenol-type, cresol-type, alkyl-type, bisphenol A type or copolymers thereof.

In the present invention, a curing accelerator may be further used for the purpose of promoting the reaction of the thermosetting resin and the multi-functional phenolic resin curing agent. The type or blending ratio of the curing accelerator is not particularly limited, and for example, imidazole compounds, organophosphorus compounds, tertiary amine, quaternary ammonium salts, and combinations of two or more thereof may be used. In the present invention, an imidazole compound is preferably used as the curing accelerator. If the imidazole-based curing accelerator is used, the curing agent may be used in an amount of approximately 0.1 to 1 parts by weight, based on 100 parts by weight of the resin mixture including (a) the bismaleimide-triazine or cyanate-based resin and (b) the epoxy resin. It may be used in an amount lower than 5 to 15% by weight. In addition, examples of the imidazole-based curing accelerator may include imidazoles such as 1-methyl imidazole, 2-methyl imidazole, 2-ethyl 4-methyl imidazole, 2-phenyl imidazole, 2-cyclohexyl 4-methyl imidazole, 4-butyl 5-ethyl imidazole, 2-methyl 5-ethyl imidazole, 2-octyl 4-hexyl imidazole, 2,5-dichloro-4-ethyl imidazole, 2-butoxy 4-allyl imidazole, and derivatives thereof. In particular, 2-methyl imidazole or 2-phenyl imidazole is preferred because of the advantages of excellent reaction stability and low cost.

The type of the (d) inorganic filler is not particularly limited, and the materials well known to those skilled in the art may be used. Examples of the inorganic filler include silica such as natural silica, fused silica, amorphous silica, and hollow silica, aluminum trihydroxide (ATH), magnesium hydroxide, molybdenum compounds such as molybdenum oxide and zinc molybdate, zinc borate, zinc stannate, alumina, clay, kaolin, talc, calcined kaolin, calcined talc, mica, short glass fiber (E glass, or glass fine powder such as D glass) and hollow glass. An average particle diameter (D50) of the inorganic filler is not particularly limited, and for example, the average particle diameter (D50) of the inorganic filler is preferably 0.2 to 5 micrometer in terms of dispersibility.

The (d) inorganic filler is used in an amount of approximately 120 to 300 parts by weight, and more preferably approximately 120 to 200 parts by weight, based on 100 parts by weight of the resin mixture including the (a) bismaleimide-triazine or cyanate-based resin, the (b) epoxy resin and the (c) novolac resin. If the content of the inorganic filler is approximately less than 120 parts by weight, separation of the resin and the inorganic filler does not occur even though novolac is not used during the high temperature and high pressure lamination process. However, because the content of the inorganic filler is low, it is difficult to manufacture a low thermal expansion substrate required in the semiconductor packaging. In addition, if the content is approximately more than 300 parts by weight, the inorganic filler deteriorates the flowability of the resin, which generates not separation but void defects (also called blurring defects in Japan) during manufacture of the copper clad laminate.

If necessary, a solvent is added to the resin composition of the present invention, and it may be used in the form of various solvent solutions. The type of the solvent is not particularly limited, as long as it shows good solubility to the resin components. Examples thereof may include alcohols, ethers, ketones, amides, aromatic hydrocarbons, esters, and nitriles, and they may be used alone or in combinations of two or more thereof. In addition, the content of the solvent is not particularly limited, as long as it is able to impregnate the glass fiber with the resin composition upon production of the prepreg.

If necessary, the thermosetting resin composition may further include one or more additives selected from the group consisting of a flame retardant, a lubricant, a dispersing agent, a plasticizer and a silane coupling agent typically added. In addition, the resin composition of the present invention may further include various polymer compounds such as other thermosetting resins, thermoplastic resins, and oligomers and elastomers thereof, other flame-retardant compounds or additives, as long as they do not deteriorate the intrinsic properties of the resin composition. They are not particularly limited, as long as they are selected from those typically used.

Meanwhile, according to another embodiment of the present invention, provided is a prepreg that is produced by impregnating the fiber base material with the thermosetting resin composition.

The type of the fiber base material is not particularly limited, and examples thereof include glass fiber base materials, synthetic fiber base materials that are made of woven or nonwoven fabrics including a main material of polyamide-based resin fibers such as a polyamide resin fiber and an aromatic polyamide resin fiber, polyester-based resin fibers such as a polyester resin fiber, an aromatic polyester resin fiber and a wholly aromatic polyester resin fiber, polyimide resin fibers and fluorine resin fibers, and paper base materials including a main material of a craft paper, a cotton linter paper and a mixed paper of linter and craft pulp, and preferably a glass fiber base material. The glass fiber base material improves strength of the prepreg, reduces absorption, and lowers the thermal expansion coefficient. The glass base material used in the present invention may be selected from various glass base materials used for the printed circuit board, and examples thereof include glass fibers such as E glass, D glass, S glass, T glass, and NE glass, but are not limited thereto. If necessary, the base material may be selected from the above glass base materials according to the intended use or performance. The glass base material is in the form of woven fabric, non-woven fabric, roving, chopped strand mat or surfacing mat. The thickness of the glass base material is not particularly limited, but it may be approximately 0.01 to 0.3 mm. Among them, the glass fiber material is more preferred in terms of strength and water absorption.

The production conditions of the prepreg for the printed circuit board are not particularly limited, but the resin composition is preferably used in a varnish state by addition of a solvent. The organic solvent for the resin varnish is not particularly limited, as long as it is miscible with the resin components. Specific examples thereof include ketones such as acetone, methyl ethyl ketone, methylisobutyl ketone, and cyclohexanone, aromatic hydrocarbons such as benzene, toluene, and xylene, amides such as dimethylformamide and dimethylacetamide, aliphatic alcohols such as methyl cellosolve and butyl cellosolve.

Upon production of the prepreg for the printed circuit board, it is preferable to volatilize 80% by weight or more of the used solvent. Owing to this, there are no limitations in the production method or drying conditions. A drying temperature is approximately 80° C. to 180° C., and a drying time is not particularly limited and can be determined depending on a gelation time of the varnish. In addition, an impregnation amount of the varnish is preferably set so that a resin solid component of the varnish becomes approximately 30 to 80% by weight, based on the total amount of the resin solid component of the varnish and the base material.

In the present invention, the production method of the prepreg is not particularly limited, and the prepreg may be produced by the method well known in the art. For example, the prepreg may be produced using an impregnation method, a coating method using any of various coaters and a spraying method using a spray.

When the impregnation method is used, the varnish is prepared, and then the fiber base material is impregnated with the varnish to produce the prepreg.

According to still another embodiment, provided is a method for manufacturing a copper clad laminate, comprising the step of integrating a metal foil including the prepreg by heating and pressing.

The metal foil includes a copper foil; an aluminium foil; a composite foil with a three-layer structure having nickel, nickel-phosphorus, nickel-tin alloy, nickel-iron alloy, lead or lead-tin alloy as the interlayer between copper layers having different thickness on either side, or a composite foil with a two-layer structure including aluminum and copper foils.

In detail, the metal foil used in the present invention is the copper foil or aluminium foil having a thickness of approximately 2 to 200 µm, and preferably approximately 2 to 35 µm. Preferably, the metal foil is the copper foil. Further, the metal foil according to the present invention is the composite foil with a three-layer structure having nickel, nickel-phosphorus, nickel-tin alloy, nickel-iron alloy, lead or lead-tin alloy as the interlayer between a 0.5 to 15 µm copper layer and a 10 to 300 µm copper layer on either side, or the composite foil with a two-layer structure including aluminum and copper foils.

When the metal foil including the prepreg is heated and the temperature reaches around 150° C. during the heating process, a part of the reaction occurs by a specific content of the novolac resin, thereby controlling the flowability. At this time, all of the resins are generally cured at approximately 200° C. or higher, and thus the maximum lamination (press) temperature becomes approximately 200° C. or higher, and typically 220° C. The pressing conditions of the metal clad laminate are not particularly limited, but approximately 0.5 to 8.0 MPa is preferred, and in particular, approximately 1.5 to 5.0 MPa is preferred.

One or more of the prepreg-including metal clad laminate thus produced are laminated, and then used for manufacturing a double-sided or multilayer printed circuit board. In the present invention, the double-sided or multilayer printed circuit board can be manufactured by circuit formation on the metal clad laminate, and the circuit formation may be performed by the method typically used in the manufacturing process of the double-sided or multilayer printed circuit board.

As such, the above described thermosetting resin composition according to the present invention can be used in various applications of printed circuit boards, and preferably in the printed circuit board for the semiconductor package.

Advantageous Effects

The present invention provides a thermosetting resin composition comprising a multi-functional phenolic resin having a predetermined equivalent weight of hydroxyl group as a curing agent, which is applicable to the production of a prepreg for a printed circuit board. Further, the prepreg is produced using the thermosetting resin composition according to the present invention, and then laminated on a metal foil, thereby manufacturing a printed circuit board having a uniform insulation layer by inhibiting separation of the resin and the inorganic filler. Therefore, the physical properties of high heat resistance, high reliability, and lower coefficient of thermal expansion can be achieved.

BEST MODE

Hereinafter, the actions and the effects of the present invention will be explained in more detail via specific examples of the invention. However, these examples are merely illustrative of the present invention and the scope of the invention should not be construed to be defined thereby.

Examples 1 to 5 and Comparative Examples 1 to 5

The ingredients were mixed according to the composition and content as in the following Tables 1 and 2, and thermosetting resin compositions of Examples and Comparative Examples were prepared, respectively.

Thereafter, each of the thermosetting resin compositions was added to methyl ethyl ketone, and mixed in a high speed stirrer until the solid content reached 50% by weight, so as to produce each resin varnish.

Subsequently, the resin varnish was impregnated into a glass fiber having a thickness of 43 µm (manufactured by Nittobo, 1078, E-glass), and then dried with hot air at 150° C. to produce a prepreg for a double-sided copper clad laminate.

Then, three of the produced prepreg were laminated, and copper foils (thickness of 12 µm, manufactured by Mitsui) were placed and laminated on both sides thereof. The laminate was heated and pressed by applying a pressure of 45 kg/cm² using a press at 220° C. for 90 minutes to manufacture a copper clad laminate (thickness: 0.15 mm).

The representative physical properties of the manufactured copper clad laminate were measured.

Further, a 4-layer printed circuit board was manufactured, and separation of resin/inorganic filler was examined.

That is, a glass fiber of 23 µm (manufactured by Asahi, 1037, E-glass) was impregnated, and then dried with hot air at 150° C. to produce a prepreg for a multilayer (resin content: 75% by weight).

Circuit formation was performed on both sides of the copper clad laminate, and each one of the prepreg for the multilayer described above and the copper foil was laminated and incorporated by heating/pressing, which was performed under the conditions of a temperature of 220° C. and a pressure of 35 kg/cm² for 90 minutes. After etching the entire surface of the copper foil of the 4-layer printed circuit board, appearance was examined, and separation of resin/inorganic filler and void generation were investigated.

Experimental Example

Evaluation of Physical Properties

Physical properties of the copper clad laminates produced in Examples and Comparative Examples were evaluated by the following methods, and the results are shown in Tables 1 and 2, respectively.

(a) Glass Transition Temperature

After removing the copper foil of the copper clad laminate by etching, glass transition temperature was measured using DMA (Dynamic Mechanical Analysis) at a heating rate of 5° C./min.

(b) Coefficient of Thermal Expansion (CTE)

After removing the copper foil of the copper clad laminate by etching, coefficient of thermal expansion was measured using TMA (Thermo Mechanical Analysis) at a heating rate of 10° C./min.

(c) Water Absorption Rate

After removing the copper foil of the copper clad laminate by etching, PCT (Pressure cooker test) was performed under the conditions of a temperature of 121° C. and humidity of 100% for 5 hours. The weight was measured before/after the treatment, and water absorption rate was calculated according to the following Equation 1.

$$\text{Water absorption rate}(\%) = \{(\text{weight of copper clad laminate after absorption} - \text{weight of copper clad laminate before absorption})/\text{weight of copper clad laminate before absorption}\} \times 100 \quad \text{[Equation 1]}$$

(d) Appearance after Etching

After peeling (etching) the copper foil of each copper clad laminate, separation of resin/inorganic filler and void generation in the resin were examined with the naked eye, and evaluated as 'absence' and 'presence' according to the occurrence.

In this regard, appearance of the double-sided copper clad laminate was also examined, and the 4-layer printed circuit board was also manufactured to examine the appearance of the prepreg for the multilayer. Typically, the prepregs having the same formulations have the high resin content, and thus separation of resin/inorganic filler occurs more easily in the prepreg for the multilayer due to high flowability. Thus, if separation is not observed in the prepreg for the multilayer, separation does not occur in the prepreg for the double-sided copper clad laminate, even though slight void defects may occur.

TABLE 1

| | | | Example | | | | |
|---|---|---|---|---|---|---|---|
| | | | 1 | 2 | 3 | 4 | 5 |
| Resin | BT resin[1] | | 38 | 0 | 34 | 34 | 38 |
| | Bisphenol A type cyanate resin[2] | | 0 | 38 | 0 | 0 | 0 |
| | Dicyclopentadiene epoxy resin[3] | | 57 | 57 | 51 | 51 | 57 |
| | Cresol-novolac resin[4] | | 5 | 5 | 15 | 15 | 5 |
| Inorganic filler | Silica[5] | | 120 | 120 | 120 | 150 | 200 |
| Basic physical properties | Glass transition temperature (DMA) | ° C. | 260 | 270 | 255 | 255 | 260 |
| | X/Y CTE (TMA) | ppm/° C. | 11 | 10 | 11 | 10 | 9 |
| | Water absorption rate (PCT, 5 hr) | % | 0.5 | 0.55 | 0.55 | 0.45 | 0.4 |
| Appearance after etching | Resin/filler separation | | absence | absence | absence | absence | absence |
| | Void | | absence | absence | absence | absence | absence | note)
[1]Nanozine-520 (Nanokor)
[2]BA-230S (Lonza)
[3]XD-1000 (Nippon Kayaku)
[4]GPX-41 (Gifu Shellac): hydroxyl equivalent weight of 120
[5]SFP-30M (Denka)

TABLE 2

| | | Comparative Example | | | | |
|---|---|---|---|---|---|---|
| | | 1 | 2 | 3 | 4 | 5 |
| Resin | BT resin[1] | 40 | 38.8 | 32 | 32 | 40 |
| | Bisphenol A type cyanate resin[2] | 0 | 0 | 0 | 0 | 0 |
| | Dicyclopentadiene epoxy resin[3] | 60 | 58.2 | 48 | 48 | 60 |

TABLE 2-continued

| | | | Comparative Example | | | | |
|---|---|---|---|---|---|---|---|
| | | | 1 | 2 | 3 | 4 | 5 |
| | cresol-novolac resin[4)] | | 0 | 3 | 20 | 20 | 0 |
| Inorganic filler | Silica[5)] | | 120 | 120 | 120 | 200 | 100 |
| Basic physical properties | Glass transition temperature (DMA) | °C. | 260 | 260 | 250 | 245 | 260 |
| | X/Y CTE (TMA) | ppm/°C. | 12 | 12 | 12 | 9 | 13 |
| | Water absorption rate (PCT, 5 hr) | % | 0.45 | 0.47 | 0.6 | 0.5 | 0.5 |
| Appearance after etching | Resin/filler separation | | presence | presence | absence | presence | absence |
| | Void | | absence | absence | presence | presence | absence | note)
[1)]Nanozine-520 (Nanokor)
[2)]BA-230S (Lonza)
[3)]XD-1000 (Nippon Kayaku)
[4)]GPX-41 (Gifu Shellac): hydroxyl equivalent weight of 120
[5)]SFP-30M (Denka)

As shown in the results of Tables 1 and 2, Examples 1 to 5 showed basic physical properties equivalent to or higher than Comparative Examples 1 to 5, and no separation of resin/filler after etching and no voids. Thus, heat resistance and reliability can be improved.

The low coefficient of thermal expansion of the substrate is required in the semiconductor packaging process in order to reduce bending (defects) that occurs during the mounting process. Therefore, since the semiconductor packaging process requires the coefficient of thermal expansion (CTE) as low as possible, high CTE is not preferred even though separation of resin/inorganic filler or void is not observed. Comparative Example 5 showed higher CTE than Examples 1 to 5 of the present invention, and it is not preferred in the process.

The invention claimed is:

1. A thermosetting resin composition comprising: (d) 120 to 300 parts by weight of an inorganic filler, based on 100 parts by weight of a resin mixture including (a) 10 to 55% by weight of a bismaleimide-triazine resin; (b) 35 to 80% by weight of an epoxy resin; and (c) 5 to 15% by weight of a multi-functional phenolic resin having a hydroxyl equivalent weight of 120 to 300 as a curing agent, wherein the bismaleimide-triazine resin has a weight average molecular weight of 2,000 to 5,000, and wherein the epoxy resin is a dicyclopentadiene epoxy resin.

2. The thermosetting resin composition according to claim 1, wherein the curing agent includes one or more novolac resins selected from the group consisting of a phenol novolac resin, a bisphenol A novolac resin, a cresol novolac resin, a phenol-modified xylene resin, an alkyl phenol resin, and a phenol-modified melamine resin.

3. The thermosetting resin composition according to claim 1, wherein the inorganic filler is one or more selected from the group consisting of silica, aluminium trihydroxide, magnesium hydroxide, molybdenum oxide, zinc molybdate, zinc borate, zinc stannate, alumina, clay, kaolin, talc, calcined kaolin, calcined talc, mica, short glass fiber, glass fine powder, and hollow glass.

4. The thermosetting resin composition according to claim 1, further comprising a solvent; and one or more additives selected from the group consisting of a curing accelerator, a flame retardant, a lubricant, a dispersing agent, a plasticizer, and a silane coupling agent.

5. A prepreg that is produced by impregnating a fiber base material with the thermosetting resin composition of claim 1.

6. The prepreg according to claim 5, wherein the fiber base material is a glass fiber base material.

7. A method for manufacturing a metal clad laminate, comprising the step of integrating a metal foil including the prepreg of claim 5 by heating and pressing.

8. The method according to claim 7, wherein the metal foil includes a copper foil; an aluminum foil; a composite foil with a three-layer structure having nickel, nickel-phosphorus, nickel-tin alloy, nickel-iron alloy, lead or lead-tin alloy as the interlayer between copper layers having different thickness on either side, or a composite foil with a two-layer structure including aluminum and copper foils.

* * * * *